United States Patent [19]

Bodahl-Johnsen

[11] Patent Number: 5,618,197
[45] Date of Patent: Apr. 8, 1997

[54] ARRANGEMENT FOR ESTABLISHING ELECTRICAL CONNECTION

[75] Inventor: Helge Bodahl-Johnsen, Huddinge, Sweden

[73] Assignee: Telafonaktiebolaget LM Ericsson, Stockholm, Sweden

[21] Appl. No.: 320,659

[22] Filed: Oct. 11, 1994

[30] Foreign Application Priority Data

Oct. 12, 1993 [SE] Sweden ................................ 93 033439

[51] Int. Cl.$^6$ ........................................................ H01R 13/00
[52] U.S. Cl. ............................................. 439/260; 439/267
[58] Field of Search ................................. 439/259, 260, 439/267, 263, 264, 59, 62, 65

[56] References Cited

U.S. PATENT DOCUMENTS

| | | | |
|---|---|---|---|
| 3,537,063 | 10/1970 | Beaulieu | 439/267 |
| 3,576,515 | 4/1971 | Frantz | 439/267 |
| 3,663,920 | 5/1972 | Lapham et al. | 439/65 |
| 3,912,353 | 10/1975 | Kasuya et al. | 439/260 |
| 4,556,268 | 12/1985 | Noschese | 439/267 |
| 5,240,430 | 8/1993 | Soes | 439/260 |

*Primary Examiner*—Hien Vu
*Attorney, Agent, or Firm*—Burns, Doane, Swecker & Mathis

[57] ABSTRACT

The invention relates to an arrangement for making a mechanical and electrical contact between contact surfaces disposed in a row along one edge-part of a printed circuit board and a respective contact finger disposed in a row in a plane of a magazine intended for several circuit boards. The row of contact surfaces is located immediately adjacent the contact fingers, and the contact fingers are moved into electrical and mechanical contact with respective contact surfaces by means of an elongated device which is moved in a direction so as to move the contact fingers into a position in which they coact with the contact surfaces. The elongated device is intended to be inserted into the magazine in a direction which lies parallel with the row of contact surfaces. An end-part of the elongated device functions to bring respective contact fingers sequentially into contact with a corresponding contact surface as the elongated device is move, and respective contact fingers are held pressed against the contact surface at an adapted pressure by the remaining part of the elongated device.

11 Claims, 1 Drawing Sheet

ARRANGEMENT FOR ESTABLISHING ELECTRICAL CONNECTION

TECHNICAL FIELD

The present invention relates to an arrangement for making electrical connections, and then particularly, but not exclusively to an arrangement for connecting mechanically and electrically each of a number of contact surfaces located in a row along one edge-part of a printed circuit board with each of a number of contact devices in the form of contact fingers disposed in a contact row in one plane of a magazine that is intended to accommodate a plurality of circuit boards, and to enable the mechanical and electrical connection to be broken when necessary.

The circuit board carrying the row of discrete contact surfaces is guided in and out of the magazine with the application of a small force and with the aid of mutually opposing grooves or the like, wherewith the contact surfaces are out of contact with the contact fingers carried by the magazine.

Conditions have also been provided wherein the board-carried contact surfaces and the row of contact fingers can be mutually so adapted that the contact surfaces of respective contact fingers will be located immediately adjacent a contact surface in the row of contact surfaces, and wherein an elongated device which functions to move the contact fingers towards and into electrical and mechanical contact with the board-carried contact surfaces is first brought to a first position in which it coacts with all contact fingers, by activating said contact fingers, and which when moved in a direction opposite the first mentioned direction causes the contact fingers to moved out of coaction with said contact surfaces.

DESCRIPTION OF THE PRIOR ART

From a constructional aspect, the inventive arrangement can be considered to be close to the arrangement described and illustrated in Swedish Patent Application 7109599-6, Publication No. 379,917 (corresponding to U.S. patent application Ser. No. 58522, filed on Jul. 27, 1970).

This publication teaches a circuit-board and circuit-block assembly in which a printed circuit board (15) has been provided with contact surfaces (16) and a contact finger (14) has been placed adjacent each contact surface (16). The contact fingers (14) are intended to be brought to positions adjacent respective contact surfaces (16) and with the contact fingers thus positioned an elongated device (40) is moved in the longitudinal direction of the contacts (11, 16) so as to press respective fingers (11) down into electrical and mechanical contact with respective contact surfaces (16) with the aid of a spring device (42), this movement of the device (40) being effected in a direction illustrated by an arrow (51), from a position shown in FIG. 2 to a position shown in FIG. 5.

With regard to the application of the present invention, this application differing somewhat from the application recited in the aforesaid patent publication, it can be mentioned that there is known to the art a magazine arrangement which is constructed to enable one or more printed circuit boards to be firmly held in the magazine but readily removed therefrom wherein the circuit boards are positioned side-by-side and can be inserted into and withdrawn from the magazine by virtue of the fact that each circuit board has upper and lower edge-parts which coact with top and bottom grooves or channels in the magazine, and wherein each circuit board carries on the edge-surface thereof that faces inwardly of the magazine carries one part of a connecting element which is intended to be moved into and out of coaction with a second part of the connecting element located adjacent the backplane of the magazine, and wherein each of the two parts of the connecting element is provided with a corresponding connecting device, such as a pin connector and socket connector.

It is also known that in the case of a magazine of this nature and when the circuit boards carry many contact devices, a considerable force is required to press the board-carried contact devices into the contact devices belonging to the backplane of the magazine, in the form of contact fields, and that a particularly heavy force is required to press the circuit board into the magazine-carried connectors over the last part of board insertion travel. A corresponding force, if not even a greater force, is required to release the contact devices.

It is known that in the case of circuit boards of this particular nature, a lever arm mechanism is required in order to press the circuit boards into the backplane connectors over the last part of their insertion movement.

In practice, the application of a lever arm system to press-in a circuit board has been found to be encumbered with certain problems, since the board-carried contact devices may come out of alignment with the backplane-carried contact devices with the subsequent risk of damage to the contact devices, since the force generated by the lever arm and acting on the board is so great that it is difficult to "feel" through the lever arm system whether the contacts are in alignment with each other or not.

SUMMARY OF THE INVENTION

Technical Problems

When considering the known state of the art as described above and when considering the technical field to which the invention belongs, it will be seen that a technical problem resides in providing an electrical connecting arrangement which satisfies the requirements recited in the introduction and to realize the advantages that are gained by using the sides of the circuit board, the upwardly and/or downwardly facing sides, to this end, and to arrange at and along these sides contact devices which belong to the magazine and therewith create conditions for activating and deactivating the mechanical and electrical contacts therebetween, namely contact between the row of contact surfaces disposed along one edge-part of a printed circuit board with each contact finger in a row of contact fingers carried by a multi-board magazine and disposed in a board plane.

It will also be seen that a technical problem resides in realizing the significance that activation of the contact fingers into mechanical and electrical contact with the card-carried contact surfaces will now be activated or deactivated from the front surface of the magazine, solely by moving an elongated device in a board-allocated plane.

It will also be seen that a technical problem is one of realizing the significance of giving the elongated device a length which conforms to the length of the circuit board, and by arranging the elongated device for movement in a direction parallel to the row of contact surfaces.

Another technical problem is one of realizing the significance, and also the simplicity of allowing one end-part of the elongated device to bend or flex respective contact fingers towards corresponding contact surfaces as the elongated member moves, wherein respective contact fingers will be held against said contact surfaces by the remaining part of the elongated device at a given pressure.

It will also be seen that a technical problem resides in realizing the significance of providing adjacent the contact fingers a base-mounted guide groove which functions to coact with and support the elongated device as it moves.

Another technical problem is one of realizing the significance of causing the first contact fingers to be connected initially to earth potential by initial movement of the elongated device, and thereafter connected to a normalized supply voltage or, alternatively, to connect each or selected contact fingers to successively increasing supply voltages.

It will also be seen that a further technical problem is one of realizing the advantages that are gained when one of several normalized supply voltages can be applied to respective circuit boards through the medium of one or more increasing voltage steps.

Solution

With the intention of providing a solution to one or more of the aforesaid problems, the present invention takes as its starting point an arrangement for making electrical connections of the kind described in the introduction.

According to the invention, the elongated device is arranged to be inserted into the magazine in a direction parallel to a row of board-carried contact surfaces and also parallel to a board-allocated plane, wherein the end-part of the device functions to sequentially bend or flex respective contact fingers into contact with corresponding contact surfaces on the circuit board as the elongated device moves, and wherein respective contact fingers are held in electric contact with respective board-carried contact surfaces at a given adapted pressure by the remaining part of the elongated device.

According to proposed embodiments which lie within the scope of the inventive concept, it is proposed that a base-mounted guide groove is provided adjacent the contact fingers for coaction with the elongated device.

According to one embodiment, the first contact finger or some of the first contact fingers is/are connected to earth potential, while supply voltages are applied to the contact finger or the contact fingers that follow the first contact finger or fingers. It is particularly proposed that the selected supply voltage applied is increased in a number of voltage steps, preferably two voltage steps, against a normalized voltage.

It is also proposed that the circuit board is provided with contact surfaces on opposite surfaces of one and the same edge-part, and that a row of contact fingers is disposed on a respective side of said edge-part, wherein a U-shaped elongated device can be arranged to move simultaneously pairs of opposing contact fingers towards one another as the device is inserted.

According to another embodiment, two or three edge-parts of the circuit board are provided with one or two rows of contact surfaces on one or both sides.

One, two or three edge-parts is/are provided with two or more parallel rows of contact surfaces and one contact finger in a row of contact fingers is intended for coaction with a contact surface in one row, another contact finger of one row of contact fingers is intended for coaction with a contact surface in an adjacent row, and so on.

Certain of the contact fingers shall be connected to a first normalized supply voltage, while other contact fingers shall be connected to one or more other normalized supply voltages which differ from the first normalized supply voltage, and so on.

Advantages

Those advantages that are primarily afforded by an inventive arrangement for making electrical connections are that when this arrangement is used for mechanical and electrical contact between each contact surface of a row of contact surfaces disposed along one edge-part of a printed circuit board with each contact finger of a number of contact fingers disposed in a plane in a multi-board magazine, or vice versa, the possibility is afforded of enabling a bottom plane or a top plane to serve as a holder for magazine-carried contact fingers and therewith create conditions which will enable a printed circuit board to be inserted easily, effectively and with only a small force into a magazine with no mechanical or electric contact between the board-carried contact surfaces and the magazine-carried contact fingers, whereafter the contact fingers can be brought into electric contact with the board-carried contact surfaces with the aid of an elongated device, by inserting the elongated device in a direction parallel with the row of contact surfaces and a board-allocated plane and behind and transversely to the contact fingers, which are moved sequentially into contact with corresponding contact surfaces by the elongated device.

The size or thickness of the elongated device can be adapted to obtain a desired contact pressure, while only a moderate force is required to insert the elongated device, which can be readily achieved by hand.

The primary characteristic features of an inventive arrangement for making electrical connections and which is based on the conditions recited in the introduction are set forth in the characterizing clause of the following claim 1.

BRIEF DESCRIPTION OF THE DRAWING

An arrangement for making electrical connections and adapted to make a mechanical and electrical contact between contact surfaces disposed in a row on one edge-part of a printed circuit board with contact fingers in a row of contact fingers belonging to a magazine intended for a plurality of printed circuit boards, said contact fingers being disposed in a bottom plane, will now be described in more detail with reference to the accompanying drawing, in which.

DESCRIPTION OF AN EMBODIMENT AT PRESENT PREFERRED

Figure 1:
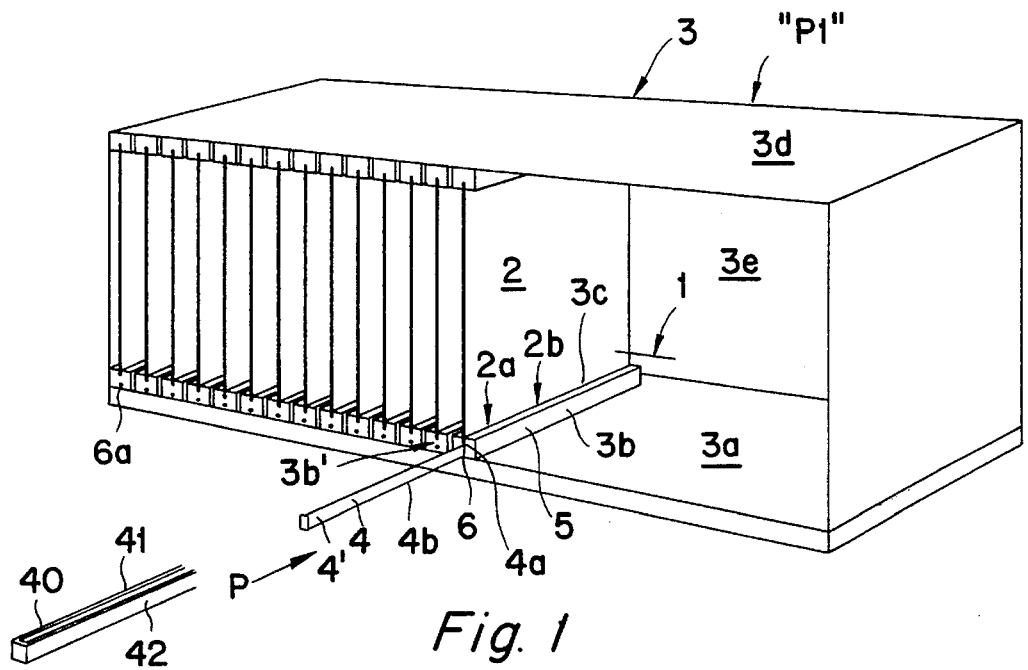
FIG. 1 is a perspective view of a magazine which accommodates a number of printed circuit boards, and shows a circuit board inserted in the magazine but out of mechanical and electric contact with the magazine-carried contact fingers.
Figure 2:
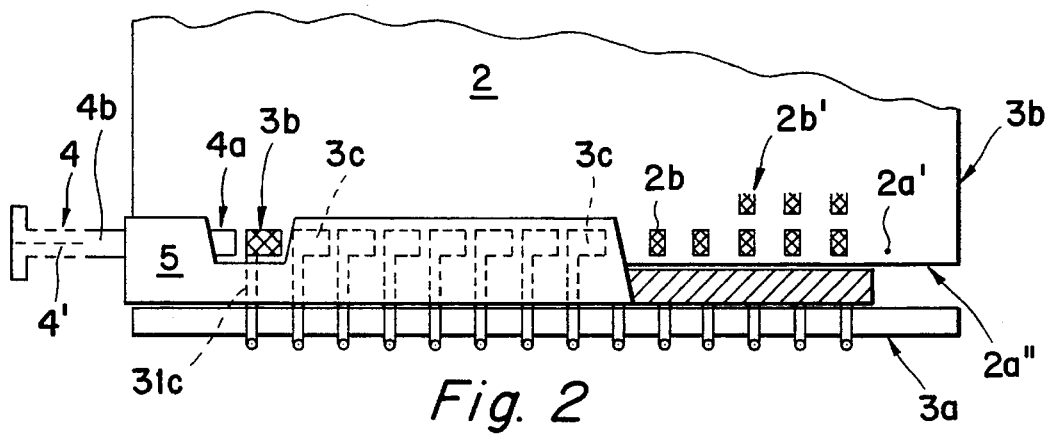
FIG. 2 is a sectioned side view of the bottom plane of the magazine and illustrates the principles of the present invention.

The present invention is based on an arrangement 1 for making electrical connections, with which each of a number of contact surfaces disposed in a row along one edge-part, a lower edge-part 2a of a printed circuit board 2 can be brought into mechanical and electrical contact with each of a number of contact devices, for instance in the form of contact fingers 3c disposed in a plane, a bottom plane 3a, of a magazine 3 which is able to accommodate a plurality of circuit boards 2, or vice versa.

The circuit boards 2 and the row 3b of contact fingers 3c are mutually so adapted as to enable a board 2 to be inserted into the magazine on one side of the contact fingers easily and with little force, such that the contact surface 3c' of each, 3b, of the contact fingers 3c will be located immediately adjacent its board-carried contact surface 2b. Movement of the contact fingers into electrical and mechanical contact with its contact surface 2b is effected with the aid of an elongated device 4, which is inserted into the magazine in the direction P, to a position in which it coacts with all contact fingers 3c, therewith moving the contact fingers towards and into contact with the contact surfaces 2b in said row of contact surfaces.

The magazine 3 includes a top plane 3d and a backplane 3e, wherein the bottom plane 3a serves in this case as the plane which carries the magazine-allocated contact rows, one for each board, these rows of contacts coacting with an electric circuit provided in the bottom plane 3a in a known manner. As indicated in FIG. 1, the elongated device 4 is intended to be inserted into the magazine in a direction P with a centre line 4' on the device 4 parallel with said row of contacts and also with a board-allocated plane, although at right angles to the vertical extension of the contact fingers 3c. The end-part 4a of the elongated device 4 will preferably be chamfered or bevelled and, as the elongated device moves, the end-part 4a thereof will act to sequentially bend or flex contact finger 3c after contact finger into contact with an opposing corresponding contact surface 2b, wherein the flexed contact fingers 3c will be held pressed against said contact surfaces 2b with an adapted force by the remaining part 4b of the elongated device.

Mounted adjacent the contact fingers 3c is a base or block 5 which includes a hole 6a opening into a guide channel 6b which receives and guides the elongated device 4 to facilitate movement of the device in the direction of the arrow P.

It will be understood that movement of the device 4 in an opposite direction will release the electrical and mechanical engagement of the contact fingers with the contact surfaces 2b on the circuit board 2, therewith enabling the board 2 to be readily withdrawn from the magazine with no contact with the contact fingers.

According to a further embodiment of the invention, of those contact fingers 3c that are first activated the very first finger 3c1 shall be connected to earth potential, whereas the second finger 3c2 and the third finger 3c3 shall be connected to different and/or increasing normalized supply voltages. This enables the supply voltage for one contact finger 3c2 to have a lower value than a normalized supply voltage, wherewith connection of the supply voltage to the circuit board and the electrical and electronic devices mounted thereon will take place in two or more steps. The earth potential and various supply voltages may be supplied from the bottom plane 3a through stems 31c of the contact fingers, for example.

Figure 3:
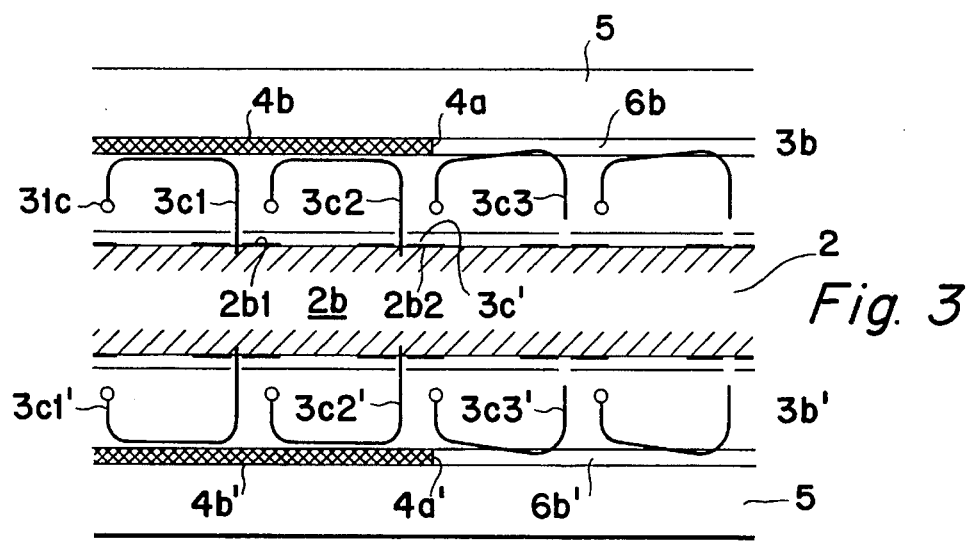
FIG. 3 is a sectional horizontal view of the electrical connection arrangement.

FIG. 3 illustrates insertion of the device 4 along the contact fingers, wherein the device 4 has pressed each of two fingers 3c1, 3c2 down into contact with respective contact surfaces 2b1 and 2b2. A contact surface 3c' of each contact finger shall be brought into electrical and mechanical contact with a contact surface 2b2.

As the elongated device 4 is pushed further into the magazine, the front part 4a of the device 4 will press down the contact finger 3c3, and so on.

A number of further alternative embodiments lie within the scope of the invention.

Depending on the requirement of contact surfaces on chosen printed circuit boards, one edge 2a may be provided with rows of contacts 2b on opposing surfaces 2a' and 2a".

This will require the provision of two rows 3b, 3b' of opposing contact fingers which are spaced mutually apart so as to enable a printed circuit board 2 to pass therebetween.

The contact surfaces 2b and 2b' and the contact fingers in the rows 3b, 3b' shall be coordinated so that respective contact fingers coact with their allotted contact surfaces on their side.

According to one arrangement, two elongated devices 4 can be used, one for each row of contacts, or alternatively there may be used a U-shaped device 40 whose legs 41 and 42 are inserted into the magazine simultaneously, so as to activate pairs of contact fingers 3c1, 3c2, and 3c 3 located on respective sides of the board at one and the same time. This embodiment is also shown in FIG. 3 where leg 41 would correspond to 4a and 4b and leg 42 would correspond to 4a and 4b.

When a circuit board is required to carry a large number of contact surfaces, two edge-parts, the bottom and the upper edge-parts, or three edge-parts, the bottom, the top and the rear edge-parts of the circuit board 2 may be provided with one or two (or more) rows 2b, 2b' of contact surfaces on one or both sides.

Each contact surface shall be capable of coacting with a contact finger also in this case, and consequently the contact fingers will be located in corresponding parallel rows.

Among these contact fingers, a "first" normalized supply voltage can be applied to one contact finger (optionally preceded by one or more contact fingers to which a lower voltage is applied), a second, a third, etc., normalized supply voltage may be applied to other contact fingers or groups of contact fingers.

Even though the elongated device 4 is advantageously inserted into the magazine in the direction indicated in FIG. 1, the magazine may be supplemented when necessary with a very large number of contact surfaces on the board 2, so that the direction indicated by the illustrated arrow P1 will apply for contact fingers positioned in a row across the backplane 3e.?

There is nothing to prevent one or more of the last contact fingers (as seen in the direction of insertion) capable of being activated by the elongated device 4 or 40 to be connected to circuits which activate the board-mounted functions, or which deactivate these functions when said device is moved in an opposite direction.

It will be observed that generated transient voltages will not only influence the applied circuit board? but also other circuit boards that have been fitted to the magazine.

It will be understood that the invention is not restricted to the aforedescribed and illustrated exemplifying embodiment thereof and that modifications can be made within the scope of the inventive concept as defined in the following claims.

I claim:

1. An arrangement for making electrical contact between at least one circuit board and magazine for receiving circuit boards comprising:

a row of contacts having surfaces disposed along at least one side of one edge of the at least one circuit board;

a block means connected to the magazine for receiving the at least one circuit board when the at least one circuit board is inserted into the magazine;

a row of contact fingers disposed in the block means for making electrical contact with the row of contact surfaces;

elongated means for sequentially engaging each of said contact fingers in electrical contact with a corresponding contact surface; and a hole opening into a channel in the block means for receiving the elongated engaging means, wherein when the at least one circuit board is inserted into the magazine each contact surface is adjacent to a corresponding contact finger and wherein the elongated engaging means is inserted into the block means via the hole opening into the channel causing each contact finger to sequentially deform to press against each corresponding contact surface, as the elongated engaging means is fully inserted, causing electrical connection between the contact surfaces and contact fingers.

2. An arrangement according to claim 1, wherein a first contact finger among a first number of contact fingers a first contact finger is connected to earth potential, and one or more following fingers are connected to one or more supply voltages.

3. An arrangement according to claim 2, a selected supply voltage is applied through a medium of increasing voltage steps.

4. An arrangement according to claim 1, wherein the one edge of the at least one circuit board includes contact surfaces and an adjacent row of contact fingers on opposing sides.

5. An arrangement according to claim 4, wherein the elongated engaging means is U-shaped and is intended to be inserted into the magazine for simultaneous activation of pairs of contact fingers.

6. An arrangement according to claim 4, wherein the at least one circuit board is provided with one or two rows of contact surfaces on two or three edges thereof.

7. An arrangement according to claim 1, wherein, one or two or three edges are provided with two or more rows of contact surfaces.

8. An arrangement according to claim 1, wherein some contact fingers are connected to a first normalized supply voltage, while other contact fingers are connected to one or more second nomarlized supply voltages that differ from the first normalized supply voltage.

9. The arrangement of claim 1 wherein the elongated engaging means is a rod.

10. The arrangement of claim 1 wherein the elongated engaging means is inserted into the block means in a plane that is parallel to the row of contact surfaces and row of contact fingers causing the contact fingers to sequential deform towards an adjacent contact surface with a predetermined force.

11. The arrangement of claim 10 wherein the elongated engaging means may be removed thereby breaking the electrical connection by releasing contact fingers to their pre-contact position.

* * * * *